United States Patent [19]

Iwai

[11] 4,455,740
[45] Jun. 26, 1984

[54] METHOD OF MANUFACTURING A SELF-ALIGNED U-MOS SEMICONDUCTOR DEVICE

[75] Inventor: Hiroshi Iwai, Tokyo, Japan

[73] Assignee: Tokyo Shibaura Denki Kabushiki Kaisha, Japan

[21] Appl. No.: 426,667

[22] Filed: Sep. 29, 1982

Related U.S. Application Data

[63] Continuation of Ser. No. 212,104, Dec. 2, 1982, abandoned.

[30] Foreign Application Priority Data

Dec. 7, 1979 [JP] Japan .................... 54-158977

[51] Int. Cl.³ .................. H01L 21/308; H01L 21/283; H01L 21/22
[52] U.S. Cl. .................... 29/571; 29/578; 29/580; 29/591; 156/648; 156/649; 156/653; 156/657; 357/55; 357/23
[58] Field of Search .............. 156/648, 649, 653, 657; 29/571, 578, 580, 591; 357/55, 23

[56] References Cited

U.S. PATENT DOCUMENTS

| | | | |
|---|---|---|---|
| 4,219,835 | 8/1980 | van Loon et al. | 357/55 |
| 4,225,879 | 9/1980 | Vinson | 357/55 |
| 4,238,278 | 12/1980 | Antipov | 156/657 |
| 4,326,332 | 4/1982 | Kenney | 156/647 |

OTHER PUBLICATIONS

Nishimatsu et al., "Grooved Gate MOSFET," Jap. J. of Applied Physics, vol. 16 (1977), pp. 179–183.
Holmes, "A VMOS-... Circuits," IEEE Transactions Electron Devices, vol. 24, No. 6, (6/77), pp. 771–774.

*Primary Examiner*—Jerome W. Massie
*Attorney, Agent, or Firm*—Finnegan, Henderson, Farabow, Garrett & Dunner

[57] ABSTRACT

A method of manufacturing a MOS semiconductor device, which comprises a step of forming a groove in a predetermined portion of a semiconductor substrate, a step of forming a gate insulation film to cover the entire surface of the substrate inclusive of the groove, a step of depositing a gate electrode material to a thickness greater than one half the width of the opening of the groove to thereby fill the groove with the gate electrode material, and a step of forming a gate electrode within the groove by etching away the gate electrode material until the gate insulation film other than that within the groove is exposed. Before the step of etching the gate electrode material, a portion of the gate material layer including a portion thereof over part of the groove and/or a portion of the layer other than that within the groove may be covered with a mask material to simultaneously form a lead integral with the gate electrode within the groove and/or a separate gate electrode at the time of the etching of the gate electrode material.

12 Claims, 16 Drawing Figures

F I G. 4(b)
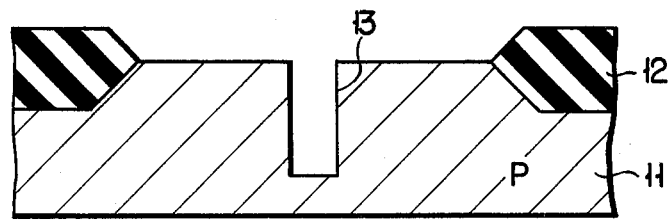
F I G. 4(c)
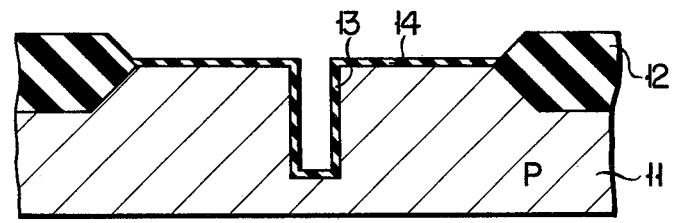
F I G. 4(d)
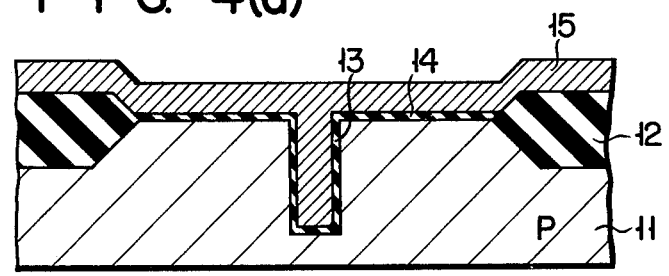
F I G. 4(e)
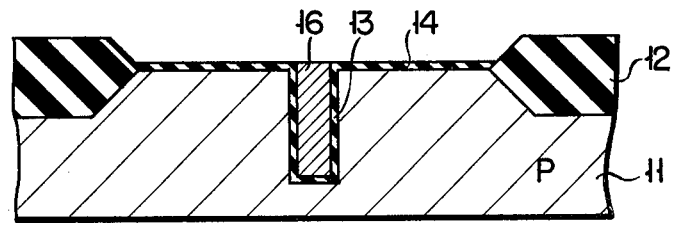

METHOD OF MANUFACTURING A SELF-ALIGNED U-MOS SEMICONDUCTOR DEVICE

This is a continuation of application Ser. No. 212,104, filed Dec. 2, 1980, now abandoned.

BACKGROUND OF THE INVENTION

This invention relates to the manufacture of MOS semiconductor devices and, more particularly, to improvements in the method of forming gate electrodes.

Recently, attempts to reduce MOS transistor size have been made in light of a demand for increasing density of integration of NMOS semiconductor integrated circuits. One approach in the case of a MOS transistor having a construction as shown in FIG. 1, which comprises a p-type semiconductor substrate 1 provided with a gate oxide film 2 and a gate electrode 3 both formed atop a principal substrate and a source 4 and a drain 5 both formed as an n+-type diffusion layer in the substrate, is to reduce the length L of the gate electrode 3 to increase the integration density. In this case, however, reduction of the threshold voltage and what is called short-channel effect such as the punch-through phenomenon are liable to result. A well-known scaling method is effective to improve the above disadvantages. This method, however, dictates reduction of the supply voltage and also increase of the substrate density. Reduction of the supply voltage leads to reduction of the margin concerning the electric noise and fluctuations of the threshold voltage. Increase of the substrate density is likely to result in increased current leak in the sub-threshold region. The significance of these problems is increased as integration density is increased. Regarding punch-through it is said that this phenomenon can be hardly prevented even by the scaling method in case where the effective channel length is less than $0.8\mu$.

A concave MOS transistor method is well known as a means for preventing the start channel affect. This method makes use of a construction as shown in FIG. 2, in which a p-type semiconductor substrate 1 is formed with a recess 6 in which a gate oxide film 2' and a gate electrode 3' are formed adjacent to source 4 and drain 5 constituted by an n+-type diffusion layer. The effective channel length L' can be increased in this case to an extent enough to prevent the short-channel effect. According to this method, the effective channel length L' can be suitably selected by appropriately setting the depth of the recess, and, by doing so, can eliminate the need of varying the drain voltage or substrate density. In the prior art method of a concave MOS transistor, however, difficulties are encountered in obtaining self-alignment of the recess 6 and gate electrode 3', and it is necessary to provide a margin A adjacent to both sides of the recess 6 in order to compensate the misalignment, as shown in FIG. 3. This is, however, undesired from the standpoint of size reduction of the MOS transistor. For example, if it is necessary to provide a margin A of $0.5\mu$, the total increase of the gate length is $1\mu$, which is a significant drawback in view of increasing the integration density of the concave MOS LSI.

SUMMARY OF THE INVENTION

In the light of the above affairs, it is an object of the invention to provide a method of manufacturing a MOS semiconductor device, which permits the reduction of the gate length of the MOS semiconductor device for achieving increased integration degree of MOS semiconductor integrated circuitry as well as preventing the occurrence of the short-channel effect and permitting ready formation of a self-aligned gate electrode without need of providing any margin that is required in the prior art for compensating for misalignment of the gate electrode at the time of the deposition thereof.

One feature of the invention resides in a method of manufacturing a MOS semiconductor device comprising a step of forming a groove in a predetermined portion of a semiconductor substrate, a step of forming a gate insulation film to cover the entire surface of the substrate inclusive of the groove, a step of depositing a gate electrode material to a thickness greater than one half the width of the opening of the groove to thereby fill the groove with the gate electrode material, and a step of forming a gate electrode within said groove by etching away the gate electrode material until the gate insulation film other than that within the groove is exposed.

A second feature of the invention is a method of manufacturing a MOS semiconductor device commprising a step of forming a groove in a predetermined portion of a semiconductor substrate, a step of forming a gate insulation film to cover the entire surface of the substrate inclusive of the groove, a step of depositing a gate electrode material to a thickness greater than one half the width of the opening of the groove to thereby fill the groove with the gate electrode material, and a step of covering a portion of the gate electrode material layer inclusive of a part thereof over part of the groove and/or a portion of the gate electrode material layer which is deemed to constitute a gate electrode other than that within the groove with a mask material, followed by etching away the gate electrode material until the gate insulation film other than portions thereof beneath the mask material layer and over the groove is exposed to thereby obtain a gate electrode within the groove and a lead disposed over a portion of the substrate outside the groove and/or a separate gate electrode formed over a portion of the substrate other than the groove.

BRIEF DESCRIPTION OF THE DRAWINGS

FIGS. 4a through 4f are sectional views showing respective steps of an embodiment of the method of manufacturing a MOS semiconductor device according to the invention;

DETAILED DESCRIPTION OF THE PREFERRED EMBODIMENTS

Figure 1:
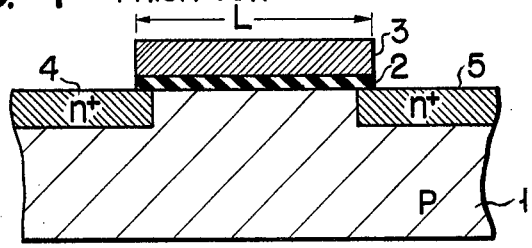
FIG. 1 is a sectional view showing a prior art MOS transistor.
Figure 2:
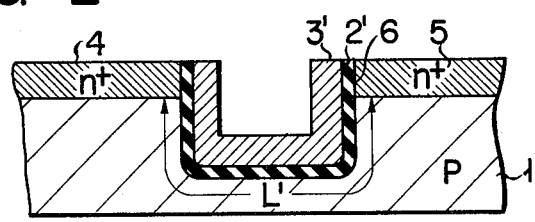
FIG. 2 is a sectional view showing this invention.
Figure 3:
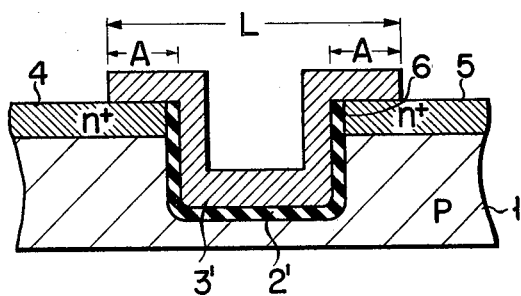
FIG. 3 is sectional view showing prior art MOS transistors.

The inventor has conducted research and investigations in order to overcome the aforementioned prior-art drawbacks in a formation of the gate electrode in a MOS semiconductor device and found a method of manufacturing a MOS semiconductor device of high integration density and high reliability by forming a groove in a semiconductor substrate, covering the substrate surface inclusive of the groove with a gate insulation film, subsequently depositing a gate electrode material to an extent enough to fill the groove and etching away the gate electrode material until the gate insulation film other than that within the groove is exposed. This process permits formation of a gate electrode having a desired depth in self-alignment to the groove without need of providing a margin for compensating a misalignment so that it is possible to achieve reduction of the gate length while preventing the short-channel effect.

The inventor has further found a method of manufacturing a MOS semiconductor device by forming, after the deposition of the gate electrode material mentioned above, a mask material layer to cover a portion of the gate electrode material layer inclusive of a part thereof over part of the groove and/or a portion of the gate electrode material layer which is deemed to constitute a gate electrode other than that within the groove and etching away the gate electrode material until the gate insulation film other than portions thereof beneath the mask material layer and over the groove is exposed. By this process, while a gate electrode can be formed in self-alignment to the groove, it is possible to obtain a MOS semiconductor device, which has a lead integral with the gate electrode within the groove and also in which gate electrodes of different types are formed on the same substrate.

The invention will now be described in detail.

The first feature of the invention will now be described. An etching mask such as a photoresist pattern having an opening corresponding to a groove to be formed in a semiconductor substrate is formed thereon, and the exposed portion of the substrate is selectively etched to a desired depth. At this time, a groove having substantially perpendicular side walls can be formed by using reactive ion etching as the etching means. It is also possible to form an outwardly or inwardly flaring groove using other etching means. Further, it is possible to form two or more grooves in the same element region. Particularly, by forming grooves having different depths, gates having different effective channel lengths can be formed. It is also possible to implant an n-type or p-type impurity on the bottom and/or sides of the groove to control threshold voltage.

Subsequently, the mask material is removed, and then a gate insulation film is formed to cover the entire surface of the semiconductor substrate inclusive of the groove. At this time, it is necessary that the groove is not filled by the gate insulation film material. The gate insulation film may be formed by a thermal oxidation, a direct nitrogenation, a CVD or a sputtering process. The thermal oxidation process is effective since it permits formation of a thin thermal oxide film of high quality.

Thereafter, a gate electrode material is deposited to a thickness greater than the width of the opening of the groove so that the groove is filled by the gate electrode material. At this time, if the extent of deposition of gate electrode material is less than one half the width of the groove, a hole is formed in the gate electrode material filling the groove. Such a hole will cause etching of the gate electrode material within the groove through it at the time of the etching process. Examples of the gate electrode material are polycrystalline silicon, polycrystalline silicon doped with such impurities as phosphorus, arsenic and boron, high-melting metals such as molybdenum, tungsten and titanium and also high-melting metal silicides such as molybdenum silicide, tungsten silicide and platinum silicide. The gate material thus deposited is subsequently etched without using any mask material until the gate insulation film other than that within the groove is exposed, and the remaining gate electrode material within the groove is used as a gate electrode of a MOS semiconductor device. As the etching means in this step, overall-etching using plasma etching or an etching liquid is employed.

The second feature of the invention will now be described. It is the same as the first feature mentioned above up to the step of depositing the gate electrode material to fill the groove formed in the semiconductor substrate. In the next step, a portion of the gate electrode material layer including a portion thereof over part of the groove, i.e., a portion over which a lead is to be formed, and/or a portion of the gate electrode material layer which is deemed to constitute a separate gate electrode are covered with a mask material, for instance a photoresist pattern. Subsequently, the gate electrode material is etched away until the gate insulation film except for portions thereof beneath the mask material and within the groove is exposed. Since the gate electrode material within the groove and under the mask material is left without being etched, it is possible to obtain a MOS semiconductor device, which has a gate electrode provided within the groove and also a separate gate electrode of the ordinary type and/or lead integral with the gate electrode within the groove.

According to the invention, it is possible to make channel implantation either after the formation of the groove in the semiconductor substrate or after the formation of the gate insulation film.

Now, examples of the invention will be described with reference to the accompanying drawings.

EXAMPLE 1

Figure 4A:
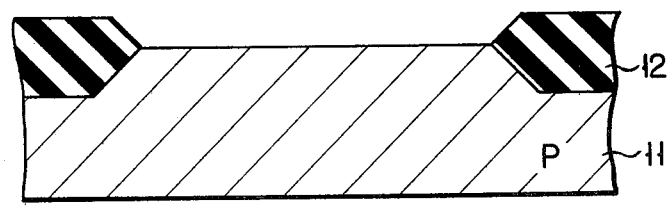

(i) A p-type silicon substrate 11, as shown in FIG. 4a, was used and an element isolation field oxide film 12 was formed atop it through selective oxidation thereof. Then, a groove, as shown in FIG. 4b, having a width of $0.5\mu$ and a depth of $1.0\mu$, was formed in the element region of the substrate 11 through a photoetching process utilizing spatter ion etching.

If necessary, ions of an n-type or p-type impurity are then implanted on the bottom of the groove, thereby forming an impurity region. Alternatively, ions of the impurity are implanted not only on the bottom of the groove but also on the sides of the groove.

(ii) The resultant wafer was then subjected to a thermal oxidation treatment in a dry oxygen atmosphere at 1,000° C., whereby a thermal oxide film 14, as shown in FIG. 4c, having a thickness of 300 Å, was grown to cover the entire surface of the silicon substrate 11 inclusive of the groove 13. Subsequently, a phosphorus-doped polycrystalline silicon film with a thickness of 3,000 Å was formed by the CVD process. At this time, the groove 13 having the width of $0.5\mu$ was filled with the same phosphorus-doped polycrystalline silicon as that of the silicon film 15 formed on the silicon substrate 11, as shown in FIG. 4d.

Figure 4F:
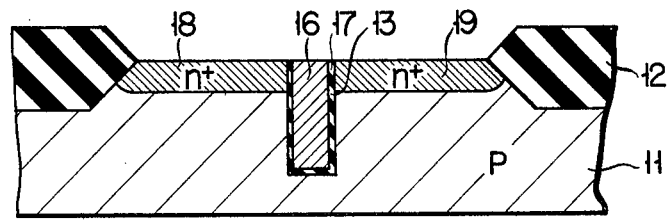

(iii) Thereafter, the phosphorus-doped polycrystalline silicon film 15 was entirely etched away using a plasma etching or an etching liquid composed of fluoric acid until the thermal oxide film 14 other than that within the groove 13 is exposed to thereby form a gate electrode 16 constituted by the phosphorus-doped polycrystalline silicon within the groove 13, as shown in FIG. 4e. Then, a portion of the thermal oxide layer 14 on the substrate 11 was selectively etched with the gate electrode 16 used as a mask to obtain a gate insulation film 17 constituted by the thermal oxidation film remaining within the groove 13. Subsequently, an n+-type diffusion layer 0.3μ thick, constituting a source 18 and a drain 19, as shown in FIG. 4f, was formed through the ion injection of arsenic into the exposed portion of the substrate 11. Afterwards, a low temperature oxide film was formed to cover the whole wafer, followed by the formation of source and drain electrodes through the formation and appropriate patterning of an aluminum film. In the above way, a MOS semiconductor device was obtained.

In the Example 1 described above, the phosphorus-doped polycrystalline silicon can be left only within the groove 13 as the gate electrode 16 in self-alignment with respect to the groove 13, and thus there is no need of providing any margin to allow for departure from the alignment between the groove 13 and gate electrode 13. Thus, it is possible to reduce the gate length and hence increase the integration density. In addition, the effective channel length of the obtained MOS semiconductor device is equal to the sum of the width of the groove 13 and twice the depth thereof minus the depth of the source 18 and that of the drain 19. In a case with a groove having a width of 0.5μ and a depth of 1.0μ and with a source and drain depth of 0.3μ, the effective channel length is 1.9μ. This value has been proved to be sufficient for preventing the short-channel effect.

Figure 5:
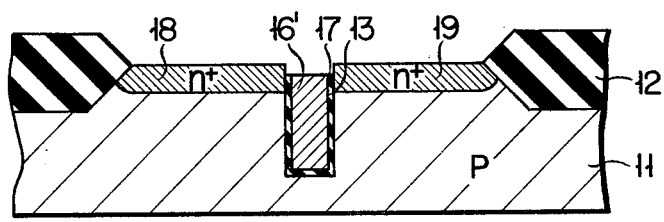
FIGS. 5, 6a, 6b and 7 are sectional views showing respective modifications of the MOS semiconductor device manufactured according to the embodiment of FIGS. 4a through 4f.
Figure 6A:
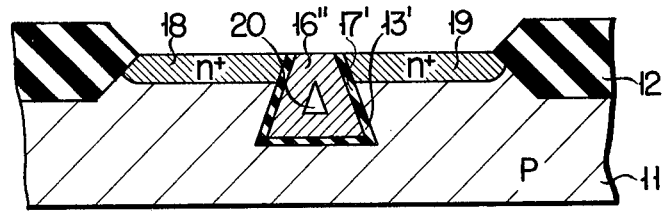
Figure 6B:
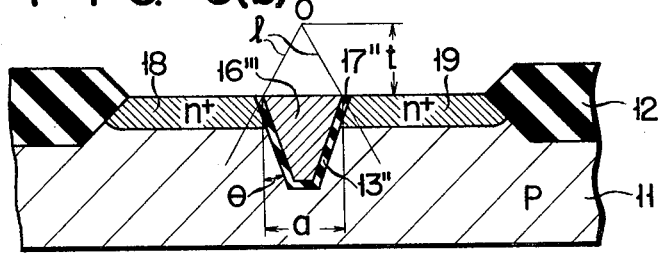

While in the above Example 1 the phosphorus-doped polycrystalline silicon was etched such that the top of the gate electrode 16 is flush with the top surface of the substrate 11, it is also possible to form a gate electrode 16' which is slightly depressed with respect to the open top of the groove 16 as shown in FIG. 5 by appropriately over-etching the phosphorus-doped polycrystalline silicon within the groove 13. Also, while in the above Example 1 the groove 16 was formed to have the side walls substantially perpendicular to the principal substrate surface, this is by no means limitative. For example, it is possible to form an inwardly flaring groove 13' and form a gate insulation film 17' and a gate electrode 16" within this groove, as shown in FIG. 6a. In this case, a cavity is formed within the groove 13'. Also, it is possible to form an outwardly flaring groove 13" and form a gate insulation film 17" and a gate electrode 16" within this groove, as shown in FIG. 6b.

In this case, the relationship between the thickness t of the deposited layer and the angle θ at which the sides of the groove incline to the vertical line can be expressed by the following formula:

$$t \geq (a/2) \tan (45° + \theta/2)$$

a: width of the groove opening.

In FIG. 6B, o is an intersection of two lines 1 which divide the angle defined by the surface of the substrate 11 and inclined sides of the groove into two equal parts.

Figure 7:
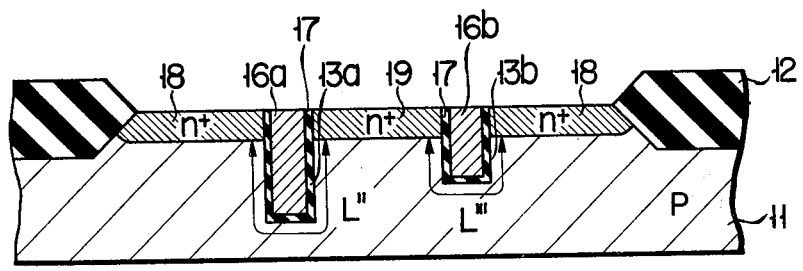

Further, while in the above Example 1 only a single gate electrode is formed in the groove formed in the element region surrounded by the field oxide film 12, it is also possible to form two grooves 13a and 13b of different widths within the element region and form gate electrodes 16a and 16b in these grooves, as shown in FIG. 7. By so doing, transistors having different effective channel lengths L" and L'" can be formed in the same element region.

EXAMPLE 2

Figure 8:
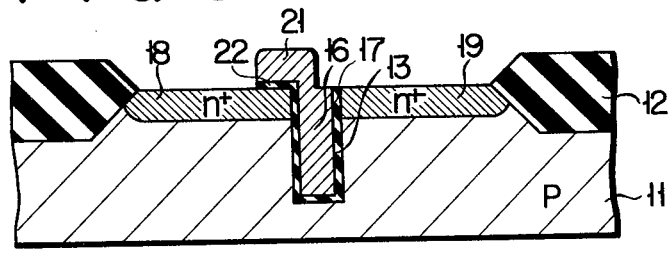
FIG. 8 is a sectional view showing a MOS semiconductor device manufactured according to Example 2 of the invention.

As in the preceding Example 1, thermal oxide film 14 with a thickness of 300 Å was formed on principal surface of silicon substrate 11 inclusive of groove 13, and then n+-type source 18 and drain 19 were formed through ion injection of arsenic. Subsequently, phosphorus-doped polycrystalline silicon was deposited to a thickness of 3,000 Å to fill the groove 13. Thereafter, a portion of the phosphorus-doped polycrystalline silicon film including a portion thereof over part of the groove 13 was covered with a photoresist, followed by etching-away of the polycrystalline silicon using a plasma etching or an etching liquid composed of fluoric acid until the thermal oxide film except for portions thereof beneath the photoresist and within the groove 13 are exposed, thus obtaining gate electrode 16 within the groove 13 and also a lead 21 which is disposed over the substrate 11 via the thermal oxide film and integral with the gate electrode 16. Afterwards, the thermal oxide film is selectively etched away using the gate electrode 16 and lead 21 as mask to obtain gate insulation film 17 and an interlayer insulation film 22 (as shown in FIG. 8).

In the above Example 2, the gate electrode lead can be formed together with the gate electrode itself, and thus it is possible to simplify the process. In addition, since the gate electrode and the lead therefor consist of the same phosphorus-doped polycrystalline silicon deposited at one time, the reliability of the contact between the gate electrode and the lead is greatly improved as compared to the prior art case of obtaining the contact through a contact hole.

EXAMPLE 3

Figure 9:
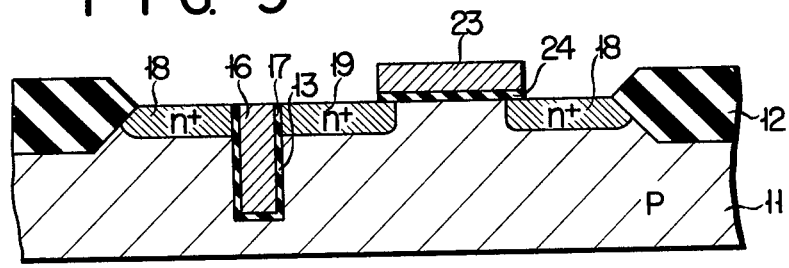
FIG. 9 is a sectional view showing a MOS semiconductor device manufactured according to Example 3 of the invention.

As in the Example 1, field oxide film 12 was formed by the selective oxidation method on p-type silicon substrate 11, and groove 13 was formed in a desired portion of the element region. Then, the entire surface of the substrate 11 inclusive of the groove 13 was covered with a thermal oxide film grown thereon, and phosphorus-doped polycrystalline silicon was deposited to a thickness of 3,000 Å by the CVD method to fill the groove 13. Subsequently, a portion of the phosphorus-doped polycrystalline film which is deemed to constitute a gate electrode other than that within the groove 13 is covered with a photoresist, followed by selective etching of the polycrystalline silicon until the thermal oxide film except for portions thereof beneath the photoresist and within the groove are exposed, thus obtaining gate electrode 16 within the groove 13 and a separate gate electrode 23 over a portion of the substrate 11 other than the grove 13. Thereafter, the thermal oxide film was selectively etched away with the gate electrodes 16 and 23 used as mask to obtain gate insulation films 17 and 24 without being etched. Afterwards, source 18 and drain 19 were formed as an n+-type diffusion layer through ion injection of arsenic (as shown in FIG. 9).

In this Example 3, the ordinary gate electrode 23 of the same material as the gate electrode 16 within the groove can be formed over the substrate 11 other than the groove 13 simultaneously with the gate electrode 16, that is, a MOS transistor having gate electrodes of different types formed on the same substrate can be obtained.

EXAMPLE 4

Figure 10:
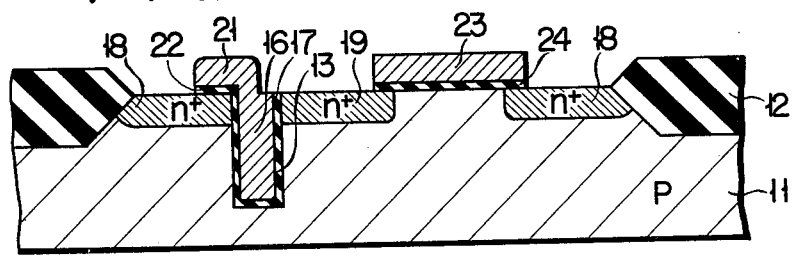
FIG. 10 is a sectional view showing a MOS semiconductor manufactured according to Example 4 of the invention.

As in the Example 1, field oxide film 12 was formed by the selective oxidation method on p-type silicon substrate 11, and groove 13 was formed in a desired portion of the element region. Then, the entire surface of the substrate 11 inclusive of the groove 13 was covered with thermal oxide film grown thereon, and then source 18 and drain 19 were formed as an n+-type diffusion layer through selective ion injection of arsenic into the substrate 11. Subsequently, phosphorus-doped polycrystalline silicon was deposited to a thickness of 3,000 Å by the CVD method to fill the groove 13. Thereafter, a portion of the phosphorus-doped polycrystalline silicon film including a portion thereof over part of the groove 13 and also a portion of the polycrystalline silicon film which is deemed to constitute a gate electrode other than that within the groove 13 are covered with a photoresist, followed by selective etching of the polycrystalline silicon until the thermal oxide film except for portions thereof beneath the photoresist and within the groove are exposed, thus obtaining gate electrode 16 within the groove 13 and also a lead 12 disposed over the substrate 11 via the thermal oxide film and integral with the gate electrode 16 as well as a separate gate electrode 23 formed over a portion of the substrate 11 other than the groove 13. Thereafter, the thermal oxide film was selectively etched away with the gate electrodes 12 and 23 and lead 21 used as mask, thus leaving gate insulation films 17 and 24, and in interlayer insulation film 22 unetched (as shown in FIG. 10).

In this Example 4, the ordinary gate electrode 16 within the groove 13 can be formed over the substrate 11 other than the groove 13 simultaneously with the gate electrode 16 within the groove 13 and the lead 21 for the gate electrode 16, and thus it is possible to extremely simplify the process. In addition, it is possible to obtain a MOS semiconductor device, which has a lead in highly reliable contact with the gate electrode 16 within the groove 13 and also in which the gate electrodes 16 and 23 of different types are formed on the same substrate.

As has been described in the foregoing, according to the invention it is possible to provide method of manufacturing a MOS semiconductor device of high integration density and high reliability in that it can achieve reduction of the gate length while preventing the short-channel effect by permitting the formation of a gate electrode having a desired depth in self-alignment to the groove without need of providing a margin for compensating any misalignment. Also, according to a second feature of the invention, it is possible to provide a method of manufacturing a MOS semiconductor device, which permits the formation of a gate electrode having a desired depth in self-alignment with respect to a groove through a simplified process and also the formation of a separate ordinary gate electrode and/or a lead integral with the first-mentioned gate electrode within the groove as well as permitting the formation of gate electrodes of different types on the same substrate.

What is claimed is:

1. In a method of manufacturing a gate electrode and source and drain regions in a portion of a semiconductor substrate between field oxide regions in a MOS semiconductor device, the improvement comprising the steps of:
   (a) forming a groove substantially U-shaped in cross-section in a predetermined exposed portion of said semiconductor substrate where said gate electrode is to be located;
   (b) forming a gate insulated film to cover the surface of said substrate inclusive of said groove;
   (c) depositing a gate electrode material on said substrate to a thickness greater than one half the width of the opening of said groove to thereby fill said groove with said gate electrode material;
   (d) forming a gate electrode by etching away said gate electrode material until said gate insulation film, except for a portion thereof within said groove, is exposed, thereby forming the gate electrode in a self-aligned manner, the gate electrode being substantially buried within the substrate such that the upper surface of the gate electrode is substantially even with or lower than the surface of the substrate surrounding the gate electrode; and
   (e) forming source and drain regions between respective side portions of the field oxide regions and respective side portions of said groove filled with said gate material by diffusing an impurity utilizing said groove filled with said gate electrode material and said field oxide regions as masks to thereby form self-aligned source and drain regions substantially only within the substrate.

2. The method of claim 1 wherein said step of forming a self-aligned gate electrode includes covering a portion of said gate electrode material, inclusive of a part thereof over part of said groove, with a mask material followed by said etching away of said gate electrode material until said gate insulation film, except for portions thereof beneath said mask material and over said groove, is exposed to thereby obtain a self-aligned gate electrode within said groove and a lead integral to said gate electrode.

3. In a method of manufacturing both a self-aligned gate electrode and a non-self-aligned gate electrode and respective source and drain regions located in a portion of semiconductor substrate between field oxide regions in a MOS semiconductor device, the improvement comprising the steps of:
   (a) forming a groove substantially U-shaped in cross-section in a predetermined exposed portion of said semiconductor substrate where said self-aligned gate electrode is to be located;
   (b) forming a gate insulation film to cover the surface of said substrate inclusive of said groove;
   (c) depositing a gate electrode material on said substrate to a thickness greater than one half the width of the opening of said groove to thereby fill said groove with said gate electrode material;
   (d) simultaneously forming both a self-aligned gate electrode and a non-self-aligned gate electrode by (i) covering a first portion of said gate electrode material remote from said groove with a mask material, (ii) etching said gate electrode material until said gate insulative film, except for portions thereof beneath said mask material and over said groove, is exposed to thereby obtain a self-aligned gate electrode within said groove and a separate non-self-aligned gate electrode beneath said mask, a substantial portion of the self-aligned gate electrode being buried within the substrate such that the upper surface of the gate electrode is substantially even with or lower than the surface of the substrate surrounding the gate electrode; and (e) forming source regions and drain regions in the substrate within the surface area defined by respective side portions of said oxide field regions by diffusing an impurity utilizing said groove filled with said gate electrode material, said field oxide regions, and said separate non-self-aligned gate electrode as masks.

4. The method of claim 3 wherein said step of simultaneously forming includes covering a second portion of said gate electrode material, inclusive of a part thereof over part of said groove, with said mask material whereby said etching obtains a lead integral with said self-aligned gate electrode.

5. In a method of manufacturing a self-aligned gate electrode and self-aligned source and drain regions located in a portion of semiconductor substrate between field oxide regions in a MOS semiconductor device, the improvement comprising the steps of:

(a) forming a groove substantially U-shaped in cross-section in a predetermined exposed portion of said semiconductor substrate where said self-aligned gate electrode is to be located;

(b) forming a gate insulation film to cover the surface of said substrate inclusive of said groove;

(c) depositing a gate electrode material on said substrate to a thickness t expressed by the formula:

$$t \geq (a/2) \tan (45° + \theta/2)$$

wherein:
a = the width of the groove opening; and
θ = the angle at which the sides of the groove incline to the vertical to thereby fill said groove with said gate electrode material;

(d) forming a self-aligned gate electrode by etching away said gate electrode material until said gate insulation film, except for a portion thereof within said groove, is exposed thereby forming the gate electrode in a self-aligned manner, the gate electrode being substantially buried within the substrate such that the upper surface of the gate electrode is substantially even with or lower than the surface of the substrate surrounding the gate electrode; and (e) forming source and drain regions between respective side portions of the field oxide regions and respective side portions of said groove filled with said gate material by diffusing an impurity utilizing said groove filled with said gate electrode material and said field oxide regions as masks to thereby form self-aligned source and drain regions substantially only within the substrate.

6. The method of claim 5 wherein said step of forming a self-aligned gate electrode includes covering a portion of said gate electrode material inclusive of a part thereof over part of said groove followed by said etching away of said gate electrode material until said gate insulation film, except for portions thereof beneath said mask material and over said groove, is exposed to thereby obtain a self-aligned gate electrode within said groove and a lead integral to said gate electrode.

7. In a method of manufacturing both a self-aligned gate electrode and a non-self-aligned gate electrode and respective source and drain regions located in a portion of semiconductor substrate between field oxide regions in a MOS semiconductor device, the improvement comprising the steps of:

(a) forming a groove substantially U-shaped in cross-section in a predetermined exposed portion of said semiconductor substrate where said self-aligned gate electrode is to be located;

(b) forming a gate insulation film to cover the surface of said substrate inclusive of said groove;

(c) depositing a gate electrode material on said substrate to a thickness t expressed by the formula:

$$t \geq (a/2) \tan (45° - \theta/2)$$

Wherein:
a = the width of the groove opening; and
θ = the angle at which the sides of the groove include to the vertical to thereby fill said groove with said gate electrode material, said thickness t being sufficient enough to preclude formation of a hole in said groove;

(d) simultaneously forming both a self-aligned gate electrode and a non-self-aligned gate electrode by (i) covering a first portion of said gate electrode material remote from said groove with a mask material, (ii) etching said gate electrode material until said gate insulative film, except for portions thereof beneath said mask material and over said groove, is exposed to thereby obtain a self-aligned gate electrode within said groove and a separate non-self-aligned gate electrode beneath said mask a substantial portion of the self-aligned gate electrode being buried within the substrate such that the upper surface of the gate electrode is substantially even with or lower than the surface of the substrate surrounding the gate electrode; and (e) forming source regions and drain regions in the substrate, within the surface area defined by respective side portions of said oxide field regions by diffusing an impurity utilizing said groove filled with said gate electrode material, said field oxide regions, and said separate non-self-aligned gate electrode as masks.

8. The method of claim 7 wherein said step of simultaneously forming includes covering a second portion of said gate electrode material, inclusive of a part thereof over part of said groove, with said mask material, whereby said etching obtains a lead integral with said self-aligned gate electrode.

9. The method according to claim 1, 2, 3, 4, 5, 6, 7, or 8 wherein said etching in said step of forming is continued until the surface of said self-aligned gate electrode is slightly depressed with respect to the open top of said groove.

10. The method according to claim 1, 2, 3, 4, 5, 6, 7, or 8 wherein said step of forming a groove includes the formation of two or more grooves having different depths.

11. The method according to claim 1, 2, 3, 4, 5, 6, 7, or 8 wherein said step of forming a groove is followed by a step of implantation of an impurity in said groove to control the threshold voltage of said semiconductor device.

12. The method of claim 1, 2, 3, 4, 5, 6, 7, or 8 wherein said step of forming a groove includes formation of a groove having a depth greater than the width of said groove.

* * * * *